(12) United States Patent
Yoo

(10) Patent No.: US 6,727,194 B2
(45) Date of Patent: Apr. 27, 2004

(54) WAFER BATCH PROCESSING SYSTEM AND METHOD

(75) Inventor: Woo Sik Yoo, Palo Alto, CA (US)

(73) Assignee: WaferMasters, Inc., San Jose, CA (US)

( * ) Notice: Subject to any disclaimer, the term of this patent is extended or adjusted under 35 U.S.C. 154(b) by 69 days.

(21) Appl. No.: 10/211,757

(22) Filed: Aug. 2, 2002

(65) Prior Publication Data

US 2004/0023517 A1 Feb. 5, 2004

(51) Int. Cl.$^7$ ............................................. H01L 21/26
(52) U.S. Cl. ...................... 438/795; 438/770; 438/580; 118/50; 118/600
(58) Field of Search ............................ 118/50, 666, 696, 118/725, 730, 729; 257/659, 421, 428; 438/795, 770, 580

(56) References Cited

U.S. PATENT DOCUMENTS

| | | | |
|---|---|---|---|
| 3,737,282 A | 6/1973 | Hearn et al. ...................... 432/6 |
| 3,811,829 A | 5/1974 | Wesson et al. ............... 432/253 |
| 4,550,245 A | 10/1985 | Arai et al. ..................... 219/405 |
| 4,680,451 A | 7/1987 | Gat et al. ...................... 219/411 |
| 4,738,618 A | 4/1988 | Massey et al. ............... 432/241 |
| 4,755,654 A | 7/1988 | Crowley et al. ............. 219/405 |
| 4,857,689 A | 8/1989 | Lee .......................... 219/10.71 |
| 4,886,954 A | 12/1989 | Yu et al. ...................... 219/390 |
| 5,001,327 A | 3/1991 | Hirasawa et al. ............ 219/390 |
| 5,114,242 A | 5/1992 | Gat et al. ..................... 374/128 |
| 5,155,336 A | 10/1992 | Gronet et al. ................ 219/411 |
| 5,165,796 A | 11/1992 | Gat et al. ..................... 374/128 |
| 5,208,643 A | 5/1993 | Fair .............................. 356/43 |
| 5,317,492 A | 5/1994 | Gronet et al. ................ 362/294 |
| 5,387,557 A | 2/1995 | Takagi ......................... 437/247 |
| 5,418,885 A | 5/1995 | Hauser et al. ............... 392/416 |
| 5,436,172 A | 7/1995 | Moslehi .......................... 437/8 |
| 5,444,217 A | 8/1995 | Moore et al. ................. 219/405 |
| 5,482,559 A | 1/1996 | Imai et al. .................... 118/728 |
| 5,512,320 A | 4/1996 | Turner et al. ................ 427/255 |
| 5,540,782 A | 7/1996 | Miyagi et al. ............... 118/724 |
| 5,561,735 A | 10/1996 | Camm .......................... 392/416 |
| 5,567,152 A | 10/1996 | Morimoto .................... 432/241 |
| 5,584,936 A | 12/1996 | Pickering et al. ........... 118/728 |
| 5,603,772 A | 2/1997 | Ide .............................. 118/724 |
| 5,639,301 A | 6/1997 | Sasada et al. ................. 118/52 |
| 5,654,417 A | 8/1997 | Tarr et al. ................. 536/24.32 |
| 5,654,904 A | 8/1997 | Thakur ........................ 364/557 |

(List continued on next page.)

FOREIGN PATENT DOCUMENTS

JP 62 087500 4/1987 ........... C30B/31/12

OTHER PUBLICATIONS

Woo Sik Yoo et al., "Susceptor–Based Rapid Thermal Processing System and Its Silicide Application", Jpn.J.Appl.Phys., vol. 37 (1998) pp. L1135–:1137. Part 2, No. 10A, Oct. 1, 1998.

(List continued on next page.)

Primary Examiner—Carl Whitehead, Jr.
Assistant Examiner—Yennhu B. Huynh
(74) Attorney, Agent, or Firm—MacPherson Kwok Chen & Heid LLP (57) ABSTRACT

A system and method for isothermally distributing a temperature across a semiconductor device. A furnace assembly is provided, which includes a processing tube configured to removably receive a wafer carrier having a full compliment of semiconductor wafers. A heating assembly is provided which can include a resistive heating element positioned to heat air or other gases allowed to enter the process tube. The wafer carrier and heating assembly are vertically raised into a position within the process tube. Once the heating assembly forms a seal with the process tube, the process tube is exhausted and purged of air. Gas is then allowed to flow into the process tube and exchange heat with the heating element. The heated gas circulates through the process tube to convectively raise the temperature of the wafers.

5 Claims, 4 Drawing Sheets

U.S. PATENT DOCUMENTS

| | | | | |
|---|---|---|---|---|
| 5,683,518 | A | 11/1997 | Moore et al. | 118/730 |
| 5,715,361 | A | 2/1998 | Moslehi | 392/416 |
| 5,830,277 | A | 11/1998 | Johnsgard et al. | 118/725 |
| 5,837,555 | A | 11/1998 | Kaltenbrunner et al. | 437/248 |
| 5,872,889 | A | 2/1999 | Kaltenbrunner et al. | 392/418 |
| 6,246,031 | B1 | 6/2001 | Yoo | 219/390 |
| 2002/0185062 | A1 * | 12/2002 | Halpin | 118/50.1 |

OTHER PUBLICATIONS

Woo Sik Yoo et al., "Highly Reliable, Backside Emissivity Independent Cobalt Silicide Process Using A Susceptor-Based Low Pressure Rapid Thermal Processing System", Jpn.J.Appl.Phys., vol. 37 (1998) pp. L1221–L1223, Part 2, No. 10B, Oct. 15, 1998.

Woo Sik Yoo et al., "Wafer Temperature Characterization in a Susceptor-Based, Low Pressure Rapid Thermal Processing System," 7$^{th}$ Int. Conf. on Advanced Thermal Processing of Semiconductors (RTP '99), Colorado Springs, Sep. 1999, pp. 1–6.

Woo Sik Yoo et al., "Characterization of a Susceptor-Based, Low Pressure RTP System in the Temperature Range of 400–1150°C", 6$^{th}$ Int. Conf. on Advanced Thermal Processing of Semiconductors (RTP '98), Kyoto, Japan, Sep. 1998, pp. 1–8.

Woo Sik Yoo et al., "Very Thin Colbalt Silicide Formation and Annealing in a Susceptor-Based Low Pressure RTP System," 6$^{th}$ Int. Conf. on Advanced Thermal Processing of Semiconductors (RTP '98), Kyoto, Japan, Sep. 1998, pp. 1–5.

George Chizinsky, "The HotShot Heated-Platen Rapid Thermal Processor", pp. 1–8.

"Rapid Thermal Processing: Equipment Technology, and Process", American Vaccm Society/New Mexico Chapter, C.B. Yarling, May 23, 1997.

* cited by examiner

WAFER BATCH PROCESSING SYSTEM AND METHOD

BACKGROUND

1. Field of the Invention

This invention generally relates to semiconductor manufacturing equipment and, more particularly, to a system and method used for the processing of semiconductor wafers.

2. Description of the Related Art

During the processing of semiconductor devices, it is highly desirable to accurately control the thermal treatment to which the devices are exposed during processing. In some instances, batches of devices, primarily wafers, are processed in a semiconductor processing furnace, which has a carefully controlled processing environment to effect the desired processes.

Of importance to the present invention are processing furnaces, which have vertically arranged wafer arrays and processing chambers. In one example, a vertically arranged thermal processor includes a vertically adjustable furnace assembly and process tube. The process tube, constructed from a quartz bell jar, is vertically moveable in up and down directions within a supporting framework in conjunction with a likewise moveable furnace assembly. Heat is supplied to the thermal processor by controlling operation of heating elements within the furnace assembly. To cool the process tube within the thermal processor, the operation of the heating elements is regulated, such that interior heat is dissipated to the exterior of the processor by convection.

Unfortunately, it has been found that in most conventional vertically arranged furnaces, the desired temperature is obtained in the process tube by surrounding the tube with heating elements. In this arrangement radiation and convection are used to heat the process tube first, before the heat energy is transferred to the cooler wafers. Convective heating is usually not effective because the process tube is typically isolated. During low temperature wafer processing operations, this type of heating arrangement is usually very inefficient and time consuming. Further, in this type of arrangement, a separate cooling chamber or blower for fast cooling of the entire furnace, is typically required since, it is difficult and inefficient to lower the temperature of the entire furnace assembly between processing operations on different batches of wafers.

For the above reasons, what is needed is a system and method for isothermally distributing a temperature across the surface of a semiconductor device which provide an accurate dynamic control of the process temperature, without degradation in uniformity of the processed wafers.

SUMMARY

The present invention provides a system and method for isothermally distributing a temperature across a semiconductor device during processing. The present invention provides a furnace assembly, which includes a processing chamber. The processing chamber can include a processing tube, such as a quartz bell jar or similar process tube, which defines an internal cavity configured to removably receive a wafer carrier or wafer boat having a full compliment of semiconductor wafers. The quartz tube is substantially enclosed in a thermal insulation material to reduce heat loss to the outside of the process chamber.

As described in greater detail below, the internal cavity of the process chamber is accessible through an opening at the bottom end of the process chamber. The opening allows the wafer carrier or wafer boat to place into the confines of the process chamber.

The wafer carrier can be mounted to an actuatable heating assembly. The heating assembly is capable of being raised into and lowered from the process chamber. When in a closed position the heating assembly seals the process tube to allow for the evacuation of the process tube in preparation for processing.

The heating assembly can include a resistive heating element, which is positioned to heat air or other gases allowed to enter the process chamber. The heating assembly can also include a reflector device, which can direct gas flow around the heating element and through the process tube.

In operation, the wafer carrier and heating assembly are vertically raised into a position within the process chamber using an actuation mechanism. Once the heating assembly forms a seal with the process tube, the process tube is exhausted or purged of air. Gas is allowed to flow into the process chamber through an inlet. The gas exchanges heat with the heating element. As the gas is made to circulate through the process tube. The reflector acts to cause the gas to circulate from the bottom end of the process tube back to the top end of the process tube. The uniform convective heating uniformly raises the temperature of the wafers.

After the wafers are processed, the heating element is powered down and a non-heated gas is allowed to flow through the process tube. The non-heated gas cools down the wafers before their removal. Once cooled, the actuation mechanism is used to remove the wafer carrier and heating assembly from the process chamber.

Advantageously, all heating and cooling of the wafers occurs internal to the process chamber using a convective type of heating. The heat transfer between the circulating heated gas and the wafers is more direct than using radiation or conduction heating arrangements. Because the wafers are cooled within the process chamber, a separate cooling chamber or blower is not required. Since the heating element has a small thermal mass, rapid ramp-up and ramp-down times are achievable.

These and other features and advantages of the present invention will be more readily apparent from the detailed description of the embodiments set forth below taken in conjunction with the accompanying drawings.

DETAILED DESCRIPTION

Figure 1:
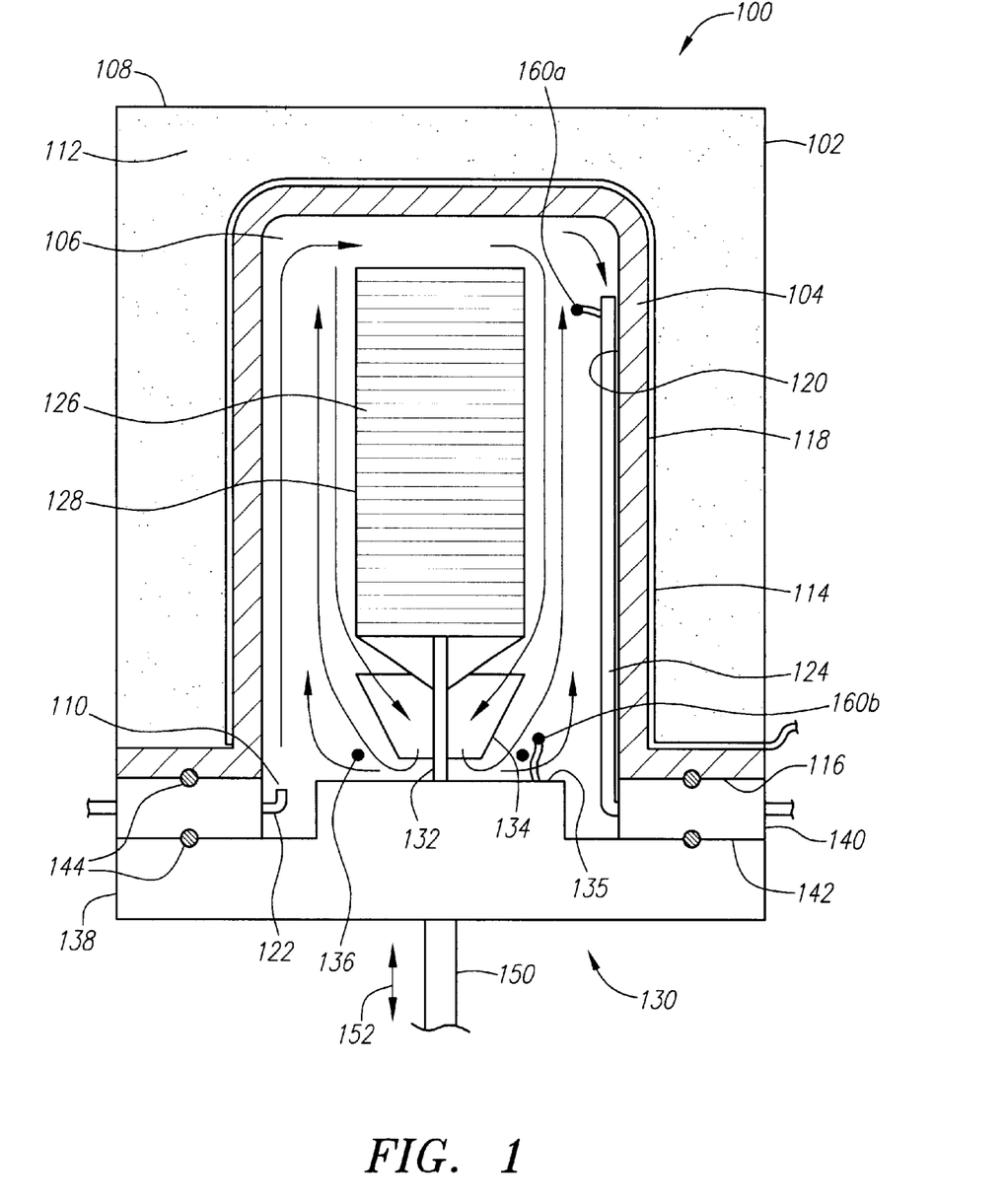
FIG. 1 is a simplified cross-sectional view of one embodiment of the present invention.

FIG. 1 is a simplified cross-sectional view of one embodiment of the furnace assembly 100 of the present invention. Furnace assembly 100 includes a process chamber 102 enclosing process tube 104, which defines an internal space 106.

Externally, in one embodiment, process chamber 102 may include a metallic housing 108, preferably made of aluminum, stainless steel, or similar metal. Within housing 108, between housing 108 and process tube 104, may be an internal thermal insulation material 112. Insulation material 112 helps to minimize heat loss from process tube 104 through housing 108 to the outside environment. Optionally, a heating element 114 may be disposed between process tube 104 and insulation layer 112 to increase the temperature around process tube 104, which further minimizes heat loss through housing 108 to the outside environment and to reduce time for the temperature within process tube 104 to stabilize. Insulation material 112 may be made of any suitable insulation material, such as a ceramic fiber material.

Process chamber 102 includes an opening 110 provided on a bottom face 112. Opening 110 is configured to receive a wafer carrier or wafer boat, including wafers for processing. Opening 110 allows for the loading and unloading of the wafer carrier from process tube 104 before and after processing.

Process tube 104 is mounted within process chamber 102. In one embodiment, process tube 104 is preferably shaped in a form similar to a bell jar. The bell jar shaped tube has a shell with an outer surface 118 and an inner surface 120. Inner surface 120 defines the perimeter of process tube 104 and interior cavity 106. Process tube 104 is formed such that interior cavity 106 has a minimal internal volume to surround the wafer carrier holding the batch of wafers. Generally, process tube 104 may be configured to withstand internal pressures of about 0.001 Torr to 1000 Torr, preferably between about 0.1 Torr and about 760 Torr.

Process tube 104 can be used to provide processing of semiconductor wafers involving exposing the batch of semiconductor wafers to various chemicals, particularly gases, at various temperatures, as is well-known, for example, in thermal heat treatments and chemical vapor deposition (CVD) processes. During such processes, processing tube 104 can be supplied with the desired processing gases via inlet tube 122. The out flowing gases are discharged through discharge tube 124. The inlet to discharge tube 124 is positioned near the portion of process tube 104 away from opening 110, the top portion, to ensure that the gases do not pool the top portion. Process tube 104 can be made from quartz or other similar material.

As shown in FIG. 1, a wafer carrier or wafer boat 128 is provided, which is capable of holding a plurality of wafers 126 in an array configured for processing. Wafer carrier 128 is formed of quartz or other suitable materials. Process tube 104 and wafer carrier 128 are constructed so as to be arranged in a coaxial arrangement, in which wafer carrier 128 can be removably received within process tube 104 as described in more detail below.

In one embodiment, wafer carrier 128 has a series of wafer receivers, advantageously formed by notches, each notch being capable of holding a wafer in position during processing. Wafer carrier 128 can be designed to hold any desired number of wafers 126, but preferably wafer carrier 128 can hold between about 25 and 50 wafers. In one embodiment, wafer carrier 104 may be configured to be coupled to a platform, which is configured for vertical movement to allow the wafer array to be installed and/or removed from process tube 104.

Figure 2:
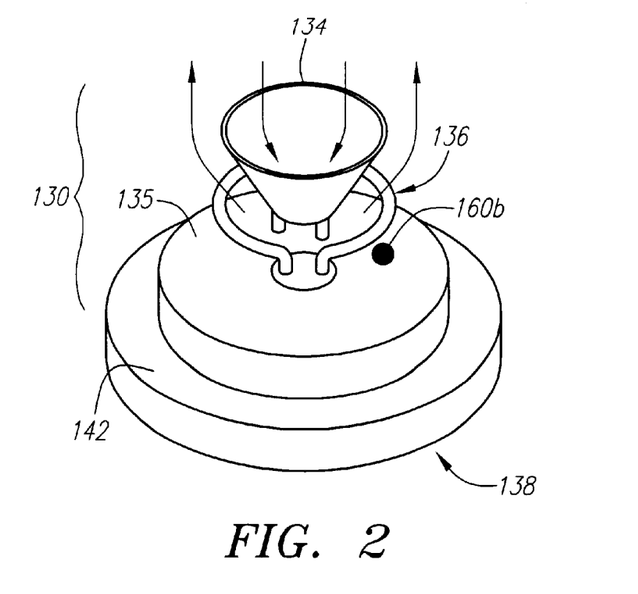
FIGS. 2, 3, 4 and 5 are simplified perspective views of a heating assemblies in accordance with embodiments of the present invention.

FIGS. 1 and 2 show an embodiment of heating assembly 130, which is configured as a means for providing the vertical movement which drives wafer carrier 128 into process tube 104. In addition to moving the wafer carrier, heating assembly 130 is configured to mate with opening 110 and seal process tube 104 during processing. In one embodiment, heating assembly 130 also includes a means for mounting a wafer carrier 132, a reflector 134, and a heating source 136 all mounted on a working surface 135 of a base or platform 138 capable of being vertically actuated using an elevation device 150.

The means for mounting 132 can include any structure capable of removably mounting wafer carrier 128 to platform 138. For example, mounting means 132 may be an open flange attached to a stem which connects the open flange to platform 138. The open flange can have a lip upon which wafer carrier 128 can be positioned. It should be understood that one of ordinary skill in the art will be able to identify multiple means for mounting 132 that are within the scope of the present invention.

The circulation of gas through process tube 104 can be facilitated using any device, which causes gas to move in a particular direction. In one embodiment, the circulation of gas through process tube 104 can be facilitated using reflector 134. Reflector 134 can be a funnel shaped device mounted at approximately the center of working surface 135 of platform 138. The funnel shape of reflector 134 can be used to direct the flow of gas near and around heating source 136. Reflector 134 also causes gases to continue to flow about wafer carrier 128 in the direction illustrated by the unnumbered arrows shown in FIG. 1. Reflector 134 can be made of Al, stainless steel, or other substantially non-reactive material. It should be understood that reflector 134 is but one example of a device that can be used to direct a gas through process tube 104.

Heat source 136 can be any heat source capable of providing the requisite heating capability needed for conducting wafer processes. For example, heat source 136 is capable of producing enough heat to cause the internal temperature of process tube 104 to rise to between about 100° C. and about 1200° C., preferably between about 100° C. and about 800° C.

In one embodiment, heat source 136 is a resistive heating element, such as a ring-shaped heating element. In this embodiment, the ring-shaped heating element is shown with reflector 134 positioned in the center of the ring; however, the placement of heat source 136 can vary between embodiments as shown below.

The resistive heating element may be any conventional heating element suitable for use in thermal processing applications. For example, the ring-shaped heating element may include a resistive heating element core wrapped by a filament wire. The core may be made of a ceramic material, but may be made of any high temperature rated, non-conductive material. The filament wire is conventionally wrapped around the core to allow for an optimal amount of radiated heat energy to emanate from the element. The filament wire may be any suitable resistively heatable wire, which is made from a high mass material for increased thermal response and high temperature stability, such as SiC, SiC coated graphite, graphite, and AlNi. Heating elements are available from Omega Engineering, Inc. of Stamford, Conn.

In other examples, the heating element may include metal sheath cartridge heaters and tubular heaters with compacted Magnesium Oxide (MGO) powder for electrical isolation.

In each embodiment, the heating elements are electrically connected to a power supply system via heating element connection terminals and associated wiring (not shown).

Heating assembly 130 is positioned on platform 138. In one embodiment, platform 138 can be made of a substantially non-reactive material, having a first tier defining working surface 135, upon which the components of heating assembly 130 may be mounted. The second tier defines lip portion 142 which is capable of interfacing with process chamber 102 to form a seal to enclose process tube 104. Platform 138 can be a machined structure, a molded structure or a similarly manufactured structure.

An elevation device 150 can be used to lift platform 138 up and down in the direction signified by arrow 152. Elevation device 150 can be any well-known device cable of performing the lifting operation required to move heating assembly 130 via platform 138, into and out from internal cavity 106 of process tube 104. For example, elevation device 150 can include a pneumatic or hydraulic lift, a mechanical worm drive or any other linear actuation device known in the industry.

The sealing of process tube 104 occurs as lip portion 142 of platform 138 contacts a flange 140 or similar device formed as an interface between process chamber 102 and heating assembly 130. In one embodiment, inlet tube 122 and discharge tube 124 can be provided through flange 140 to extend into process tube 104. Seals 144 are positioned between the contacting portions of process chamber 102 and flange 140 and contacting portions of flange 140 and lip portion 142. Seals 144 allow process tube 104 to be hermetically sealed during processing.

Referring again to FIG. 1, temperature sensors 160a and 160b are operationally coupled to a temperature controller (not shown) and used to monitor the temperature variation within process tube 104. In one embodiment, temperature sensors 160a and 160b are strategically placed in process tube 104 to provide an indication of the temperatures being developed by heating source 136. For example, sensor 160a can be strategically positioned at the top end of process tube 104 away from heat source 136. Similarly, sensor 160b can be positioned proximate to heat source 136 to monitor the temperature at the heat source. In operation, as heat source 136 is being powered up to begin heating, a temperature differential between the top end and bottom end of process tube 104 can occur for a short duration of time. The temperature difference may range from between about 10° C. and about 100° C. Temperature sensors 160a and 160b can be used to regulate the power supplied to heat source 136 to ensure that the heat source is not overheating the bottom end of process tube 104 during the delay while the top end is coming up to the desired temperature. Temperature sensors 160a and 160b may be conventional R-type or K-type thermocouples available through, for example, Omega Engineering Inc. of Stamford, Conn.

Figure 3:
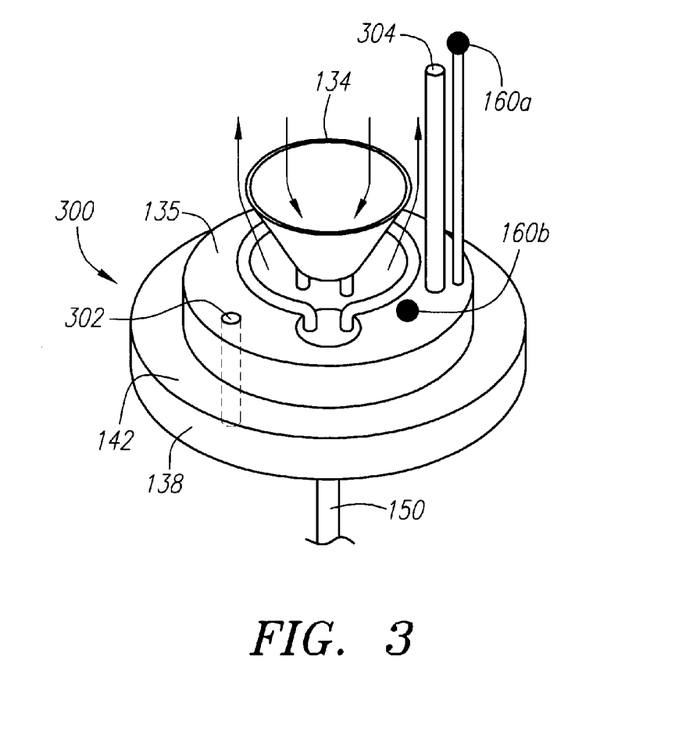
Figure 4:
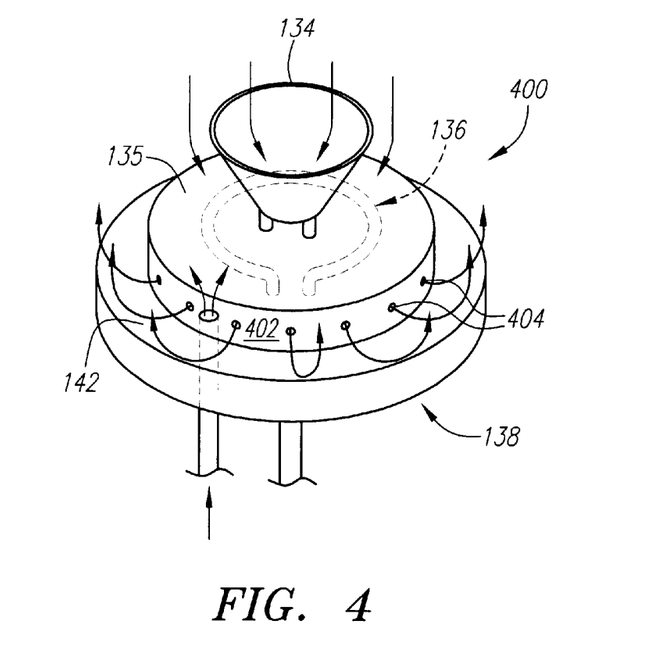
Figure 5:
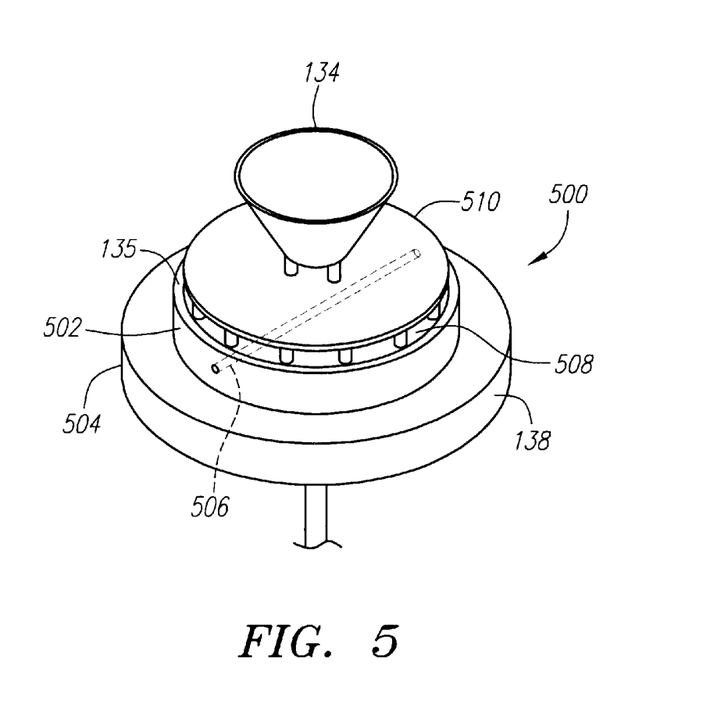

FIGS. 3, 4 and 5 are simplified illustration of heating assemblies in accordance with various embodiments of the present invention. In FIG. 3, heating assembly 300 includes, wafer carrier mounting means (not shown), reflector 134, and heat source 136 all mounted on working surface 135 of platform 138. The entire heating assembly 300 can be elevated into process tube 104 using elevation means 150.

In this embodiment, a gas inlet tube 302 is formed into platform 138 to allow gas to enter process tube 104 from an egress at working surface 135. Similarly, a discharge tube 304 can also be formed into platform 138. The ingress of discharge tube 304 extends a distance above working surface 135, such that the ingress is located at the top end of process tube 104 once platform 138 is in position to seal process tube 104.

In this embodiment, thermal sensors 160a and 160b are mounted upon working surface 135, such that the sensors enter the process tube along with heating assembly 300 and are positioned at the strategic locations identified above.

FIG. 4 is yet another embodiment of a heating assembly 400 in accordance with the present invention, including wafer carrier mounting means (not shown), reflector 134 and heat source 136. For ease of understanding, first tier 402 of platform 138 is shown as being see-through. In this embodiment, first tier 402 forms a hollowed-out chamber having a plurality of holes 402 defined around a perimeter of the tier. Heat source 136 is disposed within the hollowed out portion. A gas inlet 404 is formed though platform 138 with an egress into the hollowed-out portion of first tier 402. In this embodiment, heat source 136 heats gas entering the hollowed-out chamber of tier 402, The gas then escapes through holes 404 and into process tube 104.

FIG. 5 is an embodiment of a heating assembly 500 in accordance with the present invention, which uses radiation heating. Heating assembly 500 includes wafer carrier mounting means (not shown), reflector 134 and heat source 506. For ease of understanding, platform 138 is shown as being see-through. In this embodiment, first tier 502 and second tier 504 are both formed as hollowed-out chambers. Working surface 135 of first tier 502 includes a quartz window 508 having a heat diffusing member 510 disposed immediately thereabove. Heat diffusing member 510 may be positioned proximate to window 508 between working surface 135 and reflector 134. Heat diffusing member 510 may be any suitable heat diffusing material that has a sufficiently high thermal conductivity, preferably Silicon Carbide, Silicon Carbide coated graphite, or silicon.

In this embodiment, heat source 506 is disposed within the hollowed out portion of second tier 504. Heat source 506 may include a high intensity lamp 506, or a plurality of high intensity lamps, that provide photon energy. Examples of high intensity lamp 506 include, but are not limited to, a Tungsten halogen lamp and any filament-less high intensity lamp. Lamp 506 outputs photon energy which is allowed to emanate from second tier 504 through first tier 502 and escape through quartz window 508. Heat diffusing member 510 absorbs the photon energy emanating from window 508 and dissipates the photon energy as thermal energy into process tube 104. Gases circulating through process tube 104 are directed by reflector 134 toward heat diffusing member 510 such that the temperature of the circulating gas is increased in accordance with the present invention.

Figure 6:
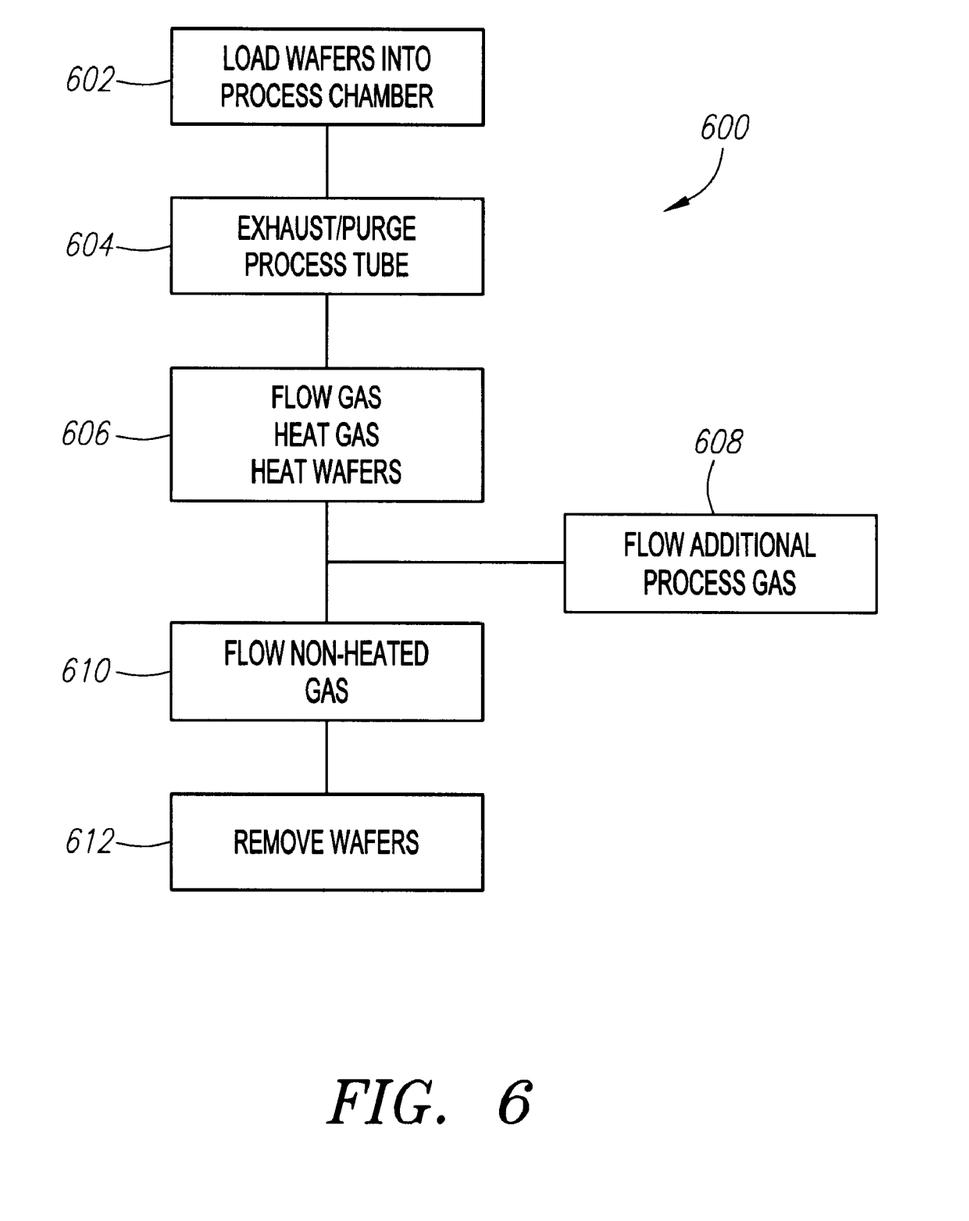
FIG. 6 is a flow diagram illustrating a method in accordance with the system of the present invention.

FIG. 6 is a flow diagram outlining a method of operation 600 in accordance with the present invention. In operation, platform 138, including wafer carrier mounting means 132, reflector 134, and heat source 136 is moved between a first position or loading position, where wafer carrier 128 may be manually loaded/unloaded or else may be automatically loaded/unloaded onto platform 138 and a second position or processing position where wafer carrier 128 is within process tube 104.

In step 602, wafers 126 are loaded via wafer carrier 128 onto the wafer carrier mounting means 132. Elevation means 150 lifts platform 138 into sealing contact with flange 140. Wafers 126 are now in position for processing.

In step 604, process tube 104 can be pumped down to substantially at or near vacuum and a purging gas, such as $N_2$, Ar, and similar gases can be allowed to flow via inlet tube 122 into process tube 104. Discharge tube 124 exhausts the gas from process tube 104. The combination of effects from inlet tube 122 and discharge tube 124 cause the gas to circulate and be purged from within process tube 104. Using the pump and purge technique allows process tube 104 to be purged of air, for example, in one embodiment, the residual $O_2$ level in process tube 104 can be reduced to about 1000 ppm and may be reduced to less than 1 ppm.

Once process tube 104 has been purged, in step 606, a process gas is allowed to flow into process tube 104. While the gas is flowing, heat source 136 is powered-up. The process gas circulating through process tube 104 absorbs thermal energy from heat source 136. The circulating process gas then circulates about wafers 126 to transfer the thermal energy to wafers 126. Reflector 134 is shaped like a funnel to direct a least a portion of the circulating process gas toward heat source 136 to facilitate the transfer of thermal energy to the process gas.

Heat source 136 is controlled using a microprocessor, process control computer and the like to control the processing of the semiconductor wafers placed in process tube 104 and may be used to monitor the status of the system for diagnostic purposes. In one embodiment, the process computer provides control signals to a controller in response to temperature data received from temperature sensor 106a at the top end of process tube 104 and sensor 106b at the bottom end of process tube 104. The controller provides control signals to an SCR-based phase controlled power supply, which provides power to heating source 136. The controller compares the temperature between sensors 106a and 106b to ensure that equilibrium is being achieved in process tube 104 and that the power supply is not causing heat source 136 to overheat the bottom end of process tube 104.

The process computer may also direct pressure setpoints to a pump assembly (not shown) as well as gas and plasma inlet flow signals to mass-flow controllers (not shown) in a gas network. In a preferred embodiment, the controller is a real-time PID, available from Omega Corporation.

Once wafers 126 are at processing temperatures, in step 608, additional process gases may be allowed to flow into process tube 104 to further process wafers 126. These gases may include, for example, $O_2$, $NH_3$, TaETO, $SiCl_4$ and the like, for film deposition and thermal process.

In step 610, heat source 136 is powered down to stop the transfer of thermal energy to the circulating gas in process tube 104. As non-heated gas continues to circulate through process tube 104, wafers 126 begin to transfer thermal energy to the non-heated gas, thus, cooling wafers 126.

In step 612, platform 138 is lowered away from process tube 104 once a desired wafer temperature has been achieved and wafer carrier 128 can be removed.

Having thus described the preferred embodiments, persons skilled in the art will recognize that changes may be made in form and detail without departing from the spirit and scope of the invention. Thus the invention is limited only by the following claims.

What is claimed is:

1. A wafer processing system comprising:
    a process chamber including a process tube configured to receive a wafer carrier configured to support a plurality of semiconductor wafers; and
    a heat source mounted on a platform, said heat source configured to be moveable from a first position where said heat source is positioned outside of said process tube and a second position where said heat source is positioned within said process tube.

2. The system of claim 1, wherein said heat source comprises a resistive heating element and a reflector.

3. The system of claim 1, wherein said heat source comprises a halogen lamp.

4. The system of claim 1, wherein said heating assembly further comprise a wafer carrier mounting means.

5. The system of claim 1, further comprising an elevation mechanism for moving said heat source from between said first position and said second position.

* * * * *

UNITED STATES PATENT AND TRADEMARK OFFICE
CERTIFICATE OF CORRECTION

PATENT NO.    : 6,727,194 B2
DATED         : April 27, 2004
INVENTOR(S)   : Woo Sik Yoo It is certified that error appears in the above-identified patent and that said Letters Patent is hereby corrected as shown below:

Column 8,
Line 28, delete "heating assembly" and insert -- heat source --.

Signed and Sealed this

Twenty-first Day of June, 2005

JON W. DUDAS
*Director of the United States Patent and Trademark Office*